Sept. 22, 1970 C. D. HICKMAN ET AL 3,529,760

FLATPACK INSTALLATION AND REMOVAL TOOL

Filed Jan. 24, 1968

INVENTORS
CHARLES D. HICKMAN &
ROBERT O. MUNGER, Jr.

BY Hurvitz, Rose & Greene

ATTORNEYS

3,529,760
FLATPACK INSTALLATION AND REMOVAL TOOL

Charles D. Hickman and Robert O. Munger, Jr., Eau Gallie, Fla., assignors to Radiation Incorporated, Melbourne, Fla., a corporation of Florida Filed Jan. 24, 1968, Ser. No. 700,270
Int. Cl. B23k *3/02*
U.S. Cl. 228—51 7 Claims

ABSTRACT OF THE DISCLOSURE

A tool for rapidly installing and/or removing integrated circuits packaged in the so-called flat-package or "flap-pack" configuration relative to a printed circuit board or other supporting or connecting member or substrate. The tool combines the function of a heat applicator with that of a gripping device, and is specifically provided in the form of a soldering iron having a pair of gripping members which when actuated firmly hold the flatpack while the soldering iron tip applies heat to simultaneously solder or desolder all leads connecting the flatpack to the printed circuit board.

BACKGROUND OF THE INVENTION

The present invention relates generally to metal fusion bonding apparatus and in particular to a combined heat applicator and workpiece holder by which the workpiece may be firmly held while leads emanating therefrom are bonded to or removed from connecting members by application of heat thereto.

As is well known in the art of microelectronic circuits in general, and integrated semiconductor circuits in particular, the integrated circuitry is generally cased in either a multi-leaded TO-5 package (i.e., the cylindrical container configuration in which many transistor types are commonly packaged) or the more recent and often preferred flat package, or so-called "flatpack." The flatpack is typically of the order of ¼" by ¼" by 1⁄16" or less thick, including its cover, although these may vary, and has leads projecting normally in planar parallel array from two opposite edges of the four edges of the package. The flatpack is usually preferred over the TO-5 package because a great number of the flatpacks can be mounted on both sides of a printed circuit board whereas the TO-5 package is of a plug-in type and is consequently suitable for mounting on but a single side of the printed circuit board. In addition, the TO-5 package is somewhat larger than the typical flatpack, being about ⅜" in diameter and about 3⁄16" in height excluding the length of the leads projecting therefrom. Accordingly, a standard 4" x 5" x 1⁄16" printed circuit board can accommodate approximately 320 flatpacks as compared with about 130 TO-5 packages.

A typical flatpack may have 10, 12, or 14 leads in the form of flat ribbons about 0.015 to 0.018 inch wide, 0.004 to 0.006 inch thick and 0.235 to 0.360 inch long. The ribbon-like leads may be welded or soldered and, as previously stated, normally extend in parallel array from two opposite sides or edges of the flat, generally square package. On occasion, leads also project from a third edge or all edges of the flatpack in the larger lead packages, but are bent or curved to assume an orientation parallel to the leads projecting from the principal edges of the device. Typically, the flatpack comprises a silicon circuit chip disposed in the shallow cavity of a square of hard glass through which the ribbon-like leads of low expansion metal are fused, with the ends of the leads inside the cavity exposed for connection to the circuit chip. The package is closed by an insulative cover, such as ceramic material, and is provided with a hermetic high temperature seal.

Clearly, such microelectronic circuit packages are effective to reduce the size and weight of an overall circuit or system, as is generally true of all microminiature circuits. However, despite such advantages, we have observed that a significant problem exists in respect to soldering and desoldering the leads from the printed circuit board when connection or removal, respectively, of the flatpack or packs is necessary or desirable. In particular, the flatpack is typically removed from its printed circuit board by individually heating each lead until the solder thereat is sufficient soft to permit lifting the desoldered lead by use of tweezers. The complete flatpack may then be removed with the tweezers, after all leads have been desoldered, the total operation taking approximately five minutes or more for each flatpack involved.

Accordingly, it is a primary object of the present invention to provide a tool useful in substantially reducing the time interval usually required to remove flatpacks from printed circuit boards, and by a much less tedious procedure than has been available with prior art tools.

It is a more specific object of the present invention to provide a combination tool permitting the gripping, desoldering (or soldering), and lifting of a flatpack in a substantially single operation requiring but one hand of the operator and a total elapsed time of approximately 15 seconds.

We are, of course, quite aware that the provision of combination tools for generally effecting the gripping of a workpiece to be soldered or desoldered and the application of heat thereto is not a novel concept per se. For example, tools which combine the operation of pliers and soldering iron such that the workpiece or soldered joint may be gripped in the jaws of the pliers, one gripping member of which constitutes the tip of the combined soldering iron, and simultaneously heated to a temperature to melt the solder and thereby remove the workpiece or disengage the joint, are disclosed by Haberman in U.S. Pat. No. 2,469,877 and by Zana et al. in U.S. Pat. No. 2,514,736. Still another configuration of a combination tool of the type presently under discussion, in which both members of the pliers or gripping structure are utilized to heat the items to be soldered, the solder material being selectively feedable into the plier jaws region, is disclosed by Weston in U.S. Pat No. 2,228,291. Weston's proposed device includes contact means for holding the parts to be joined in their desired relative positions in combination with means for opening and closing an electrical circuit and further means for advancing and retracting the material for the joining operation.

While such tools are quite suitable for their intended purposes, they are generally far too complex and bulky to admit of any utility in the bonding and/or removal of integrated circuit flatpacks. Moreover, any combination or attempted combination of the gripping member or members with the soldering iron in such a manner that a gripping member actually functions as the soldering iron tip clearly allows the application of heat to a piece or part being gripped, and except in the case of relatively large heat dissipating bodies, can result in extensive damage to the gripped or supported part.

SUMMARY OF THE INVENTION

Briefly, according to an embodiment of the present invention the standard soldering iron is provided with a U-shaped or channeled head by which to permit simultaneous application of heat along two parallel lineal paths. Preferably each projecting tip of the head has a heat applying surface cut at a sufficient angle to the axis of the body of the iron to permit convenient application of heat to the leads to be bonded or desoldered while holding the iron at a comfortable angle deviating from the normal to the flat pack. The body of the iron, and preferably the handle thereof, has attached thereto a resilient clamping member which is pivoted in response to activation of a thumb-operated mechanism to coact or cooperate with a second clamping member of relatively fixed position and poor heat conducting characteristics projecting into the space or gap between the twin tips of the U-shaped or channeled soldering head.

In operation for removal, the latter fixed clamping member or grip is slipped under or against the edge of the flatpack case while the soldering iron head is held such that the lineal parallel tips are pressed against the solder connections for the ribbon-like leads at both sides of the flatpack case. The pivotal clamping member is moved into position against the other edge of the flatpack (i.e., the edge opposite that against which the fixed clamping member abuts) by actuation of the thumb-operated pressure arm mechanism, whereby the flatpack is firmly and securely gripped and readily removed as the soldered joint for every lead is melted in a single operation.

BRIEF DESCRIPTION OF THE DRAWINGS

The above and still further objects, features and attendant advantages of the present invention will become apparent from a consideration of the following detailed description of a preferred embodiment thereof, especially when taken in conjunction with the accompanying drawings, in which.

DESCRIPTION OF THE PREFERRED EMBODIMENT

Figure 1:
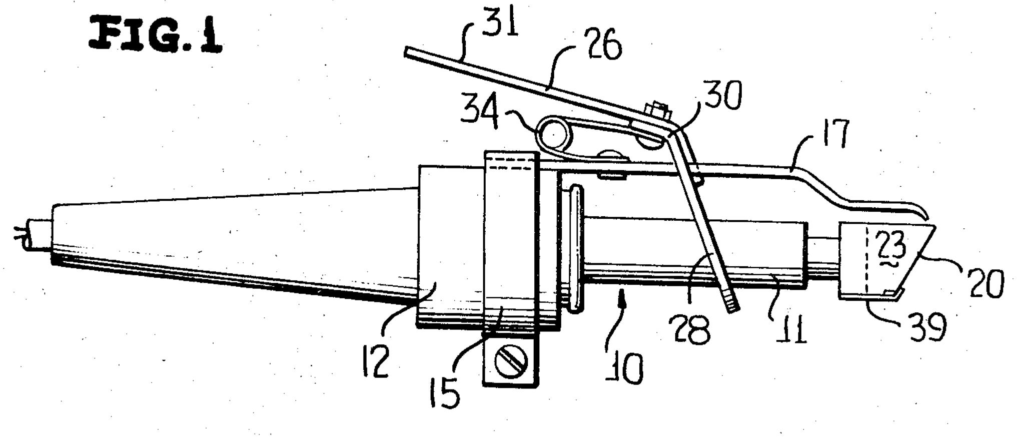
FIG. 1 is a side view of a tool according to the invention.
Figure 2:
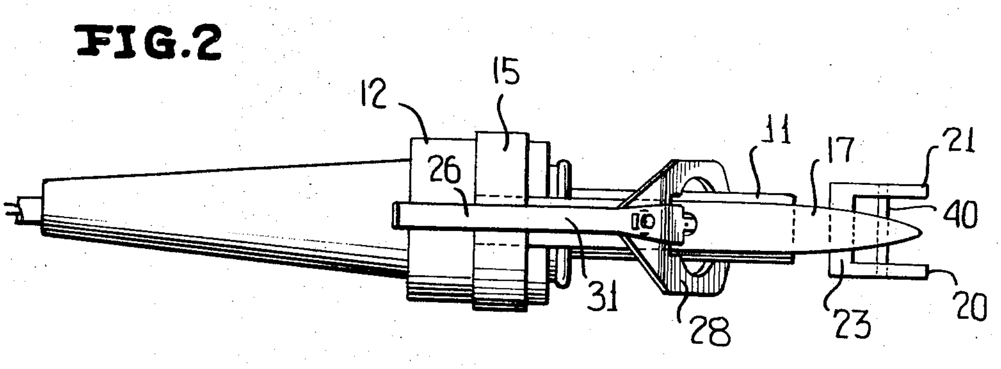
FIG. 2 is a top view of the tool of FIG. 1.

Referring now to the drawing in general and to specific figures when reference to a detailed view of that portion being described will aid the understanding of the reader, the body 11 and insulated handle 12 of the combination tool 10 is part of a standard soldering iron such as a Hexacon 25 watt 110–120 volt iron (FIGS. 1 and 2). To insulated handle 12 of the iron there is attached, by means of an adjustable hose clamp 15, for example, a thin resilient gripping or clamping member 17 fabricated, for example, of spring steel and projecting in generally axially parallel relationship to the body 11 of the iron to a point of projection approximately equal to or short of the extremity of the tips 20, 21 of the soldering iron head 23, for reasons which will become apparent presently.

A thumb-operated presure arm or actuating mechnism 26 is provided for the upper gripping member 17, including a ring-like sleeve 28 having an inner diameter greater than the diameter of the body portion 11 of the iron such that the sleeve may be slipped over the body portion when the upper gripping or clamping member 17 and the hose clamp 15 are installed on the iron. The sleeve 28 has a curved or angled portion 30 suitable for receiving a thumb-depression member 31 in mating realtionship therewith and is fastened to the upper gripping member by a wire spring, leaf spring, or other resilient member 34, such that when the pressure arm mechanism 26 is forced downwardly by the thumb of the operator, upper gripping member 17 pivots about its clamped end toward the tip of the iron.

Figures 3, 4:
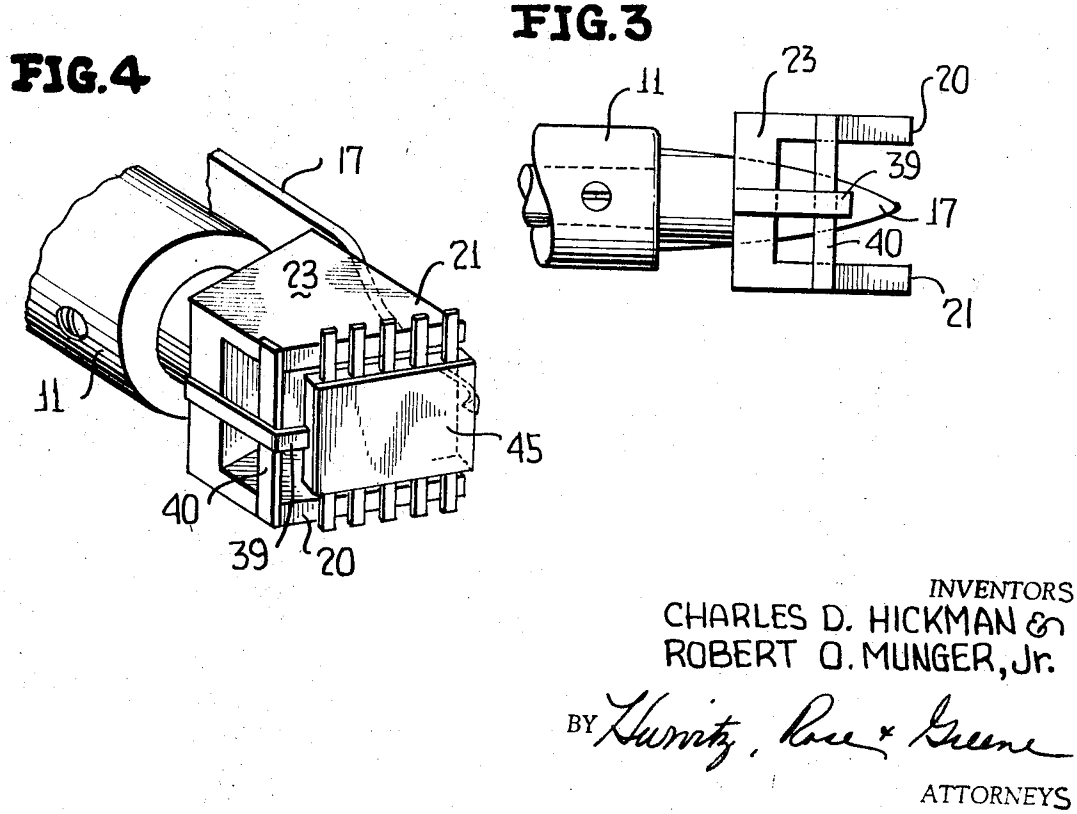
FIG. 3 is a fragmentary view of a portion of the soldering iron including the head, and of the fixed gripping or clamping member associated therewith.
FIG. 4 is a fragmentary perspective view illustrating the manner in which a flatpack is gripped by the tool of the preceding figures.

An important feature of the present invention resides in the structure of the soldering iron head, which may be provided on a threaded shaft suitable for engagement with the standard tapped hole in the body portion 11 of the soldering iron. The soldering or desoldering head 23 comprises a U-shaped or channel member including a pair of projecting tips 20, 21 connected via a bridge portion to the threaded shaft. The ends of the projecting elements or tips 20, 21 are skewed at a slight angle to the axis of the soldering iron for reasons of convenience and comfort of handling when a soldering or desoldering operation is performed. Located adjacent the lower portion of the soldering iron head, opposite that at which the upper gripper member resides, there is provided a preferably fixed lower gripping member 39 (see detailed FIG. 3) which is preferably attached to the head 23 by spot welding and which may be further supported by a ribbon-like bridge 40 spot welded between the projecting tips of the head. In the event that lower gripping member 39 is attached directly to the soldering head in the manner described, it is preferable that it be of such narrow dimensions and of such material as to prevent the ready conduction of heat, when the iron is energized, from the head to the flatpack maintained in the jaws of the gripping members. Of course, lower gripping member 39 may be secured to the iron in other arrangements, such as by clamping to the handle. Typically, lower gripping member 39 is composed of nickel ribbon of approximately .030 inch width.

Other typical dimensions are as follows: The desoldering head may have a threaded shaft of from approximately 1⅛ to about 1⅜ inches in length, with the U-shaped portion on which projecting tips 20, 21 are provided being about ½ inch in length at its widest point and tapering down to approximately ⅜ inch or less in length at its narrowest point. The projecting tips themselves may be approximately 1⁄16 inch thick and are separated or spaced by a distance approximating that between the solder joints for the multiple leads at either side of the flatpack. The lower gripping member 39 projects at an angle upwardly of the base of the soldering head by about 1⁄16 inch or less, and the tip of upper gripping member 177 also projects downwardly toward the soldering head by about that amount.

When the tool is to be used to remove a standard flatpack such as 45 (FIG. 4) the tip of the lower or rear gripping member 39 is placed against one edge of the flatpack case such that the two projecting tips 20, 21 of the desoldering head lie across all of the leads 47, 48 projecting from respective opposite edges of the flatpack case in the regions thereof at which solder has been applied. Pressure is then applied by the thumb of the operator to the arm 31 of actuating mechanism 26 whereby to force upper or front gripping member 17 toward the edge of the flatpack opposite that at which the tip of lower gripping member 39 is disposed. Accordingly, heat is applied (the iron being energized from a suitable source of power in conventional fashion) to the multiple soldered joints simultaneously with the gripping of the flatpack between the jaws of the gripping members; and as the solder melts, the flatpack may be simply lifted from the printed circuit board by means of the gripping members. Since each lead of the flatpack is desoldered simultaneously with all of the other leads there is no opportunity for one or more of the leads to be rejoined to the board by a "cold solder joint" as the solder is melted at others of the leads. Moreover, it will be observed that the flatpacks are removable from a printed circuit board, without disturbing the mounting lands on the board, in a simple and rapid one-hand operation. We have found that a standard flatpack may be removed from a circuit board by the described operation in a period of approximately 15 seconds.

While we have disclosed a preferred embodiment of our invention, it will be apparent to those of ordinary skill in the art to which the invention pertains that variation of the specific details of construction which have been described and illustrated may be resorted to without departing from the spirit and scope of the invention as defined in the appended claims.

We claim:

1. In combination, a heat applicator for melting solder, and a gripping tool for maintaining a flat-pack in position while said solder is melted; said flat-pack including leads and a body portion supporting said leads, said heat applicator comprising a body portion having means for generating heat, a head portion received by and secured in said body portion for conducting heat therefrom to a zone to be heated, said head portion comprising a U-shaped channel member having a pair of spaced projecting tips spaced for simultaneously applying heat to said leads, said gripping tool comprising a pair of gripping members for gripping said element, at least one of said gripping members being pivotally secured relative to said body portion, means for activating said gripping member toward the other of said gripping members for firmly holding said body portion during application of heat to said leads by said spaced projecting tips.

2. The combination according to claim 1 wherein said other of said gripping members is maintained in fixed position relative to said head portion.

3. In combination, a heat applicator for melting solder, and a gripping tool for maintaining an element in position while said solder is melted; said heat applicator comprising a body portion including means for generating heat, a head portion received by and secured in said body portion for conducting heat therefrom to a zone to be heated, said head portion comprising a U-shaped channel member having a pair of spaced projecting tips for simultaneously applying heat to two separated zones; said gripping tool comprising a pair of gripping members, at least one of said gripping members being pivotally secured relative to said body portion, means for activating said pivotally secured gripping member toward the other of said gripping members for firmly holding said element during application of heat to the solder joints thereof, wherein said other of said gripping members is maintained in fixed position relative to said head portion, wherein said other gripping member is fastened to said head portion between said projecting tips, and said one gripping member is pivotal toward the space between said tips.

4. In combination, a heat applicator for melting solder, and a gripping tool for maintaining an element in position while said solder is melted; said heat applicator comprising a body portion including means for generating heat, a head portion received by and secured in said body portion for conducting heat therefrom to a zone to be heated, said head portion comprising a U-shaped channel member having a pair of spaced projecting tips for simultaneously applying heat to two separated zones; said gripping tool comprising a pair of gripping members, at least one of said gripping members being pivotally secured relative to said body portion, means for activating said pivotally secured gripping member toward the other of said gripping members for firmly holding said element during application of heat to the solder joints thereof, wherein said element is an integrated circuit flatpack having a plurality of leads extending from opposite edges thereof, an electrical connection support for said flatpack, said leads soldered to said electrical connection support, and wherein said projecting tips of said head portion are lineal and parallel and are spaced sufficiently to simultaneously apply heat to the soldered joints of said plurality of leads projecting from both edges of said flatpack.

5. In a device for soldering or desoldering a flat-pack, having a body and two sets of leads extending in mutually opposite directions from said body, a soldering iron including a U-shaped heating element having two spaced heating jaws, the spacing between said spaced jaws being equal to the separation between said sets of leads and the space between said jaws being sufficient to receive said body, said flat pack having first edges extending parallel to said two sets of leads and having further edges orthogonally related to said first edges, said leads extending from said further edges, and clamp means for at will gripping said first edges in operating position relative to said two spaced heating jaws.

6. The combination according to claim 5, wherein said clamp means includes a first jaw fixedly secured to said U-shaped heating element and a movable jaw, and spring biasing means operable in response to pressure to move said movable jaw.

7. The combination according to claim 6, wherein is included a ring clamp detachably securing said movable jaw and said biasing means to said device.

References Cited

UNITED STATES PATENTS 2,469,877 5/1949 Haberman ---------- 228—51

FOREIGN PATENTS 463,162 3/1937 Great Britain.

JOHN F. CAMPBELL, Primary Examiner

R. J. CRAIG, Assistant Examiner

U.S. Cl. X.R.

219—229; 228—52, 53, 54